United States Patent [19]
Hicok et al.

[11] Patent Number: 5,742,249
[45] Date of Patent: Apr. 21, 1998

[54] SYSTEM USING A DIGITAL TIMER FOR A JOYSTICK POTENTIOMETER READOUT

[75] Inventors: Gary Hicok, Mesa; Kenneth Potts, Gilbert; Scott Harrow, Scottsdale, all of Ariz.

[73] Assignee: VLSI Technology, Inc., San Jose, Calif.

[21] Appl. No.: 652,955

[22] Filed: May 24, 1996

[51] Int. Cl.[6] .................................................. H03M 1/34
[52] U.S. Cl. ...................................... 341/164; 341/165
[58] Field of Search ........................................ 341/164, 165

[56] References Cited

U.S. PATENT DOCUMENTS

| | | | |
|---|---|---|---|
| 4,549,098 | 10/1985 | Fushiki | 307/352 |
| 4,581,483 | 4/1986 | Ralston | 178/18 |
| 5,277,497 | 1/1994 | Enomoto | 377/114 |
| 5,481,214 | 1/1996 | Tamaki et al. | 327/172 |

*Primary Examiner*—Jeffrey A. Gaffin
*Assistant Examiner*—Jason A. Vick
*Attorney, Agent, or Firm*—LaValle D. Ptak

[57] ABSTRACT

A system is provided for digitizing the setting of a potentiometer of the type used in an analog joystick for computer games. The analog output of the potentiometer is applied to one of two inputs of a voltage comparator. When a readout of the joystick position is desired, a "write" input is applied to a counter to permit it to commence counting at a predetermined frequency from an initial or zero count. The digital outputs of the counter are coupled to the inputs of a digital-to-analog converter, the output of which is coupled to the second input of the voltage comparator. When the count in the counter produces a voltage at the output of the digital-to-analog converter corresponding to the voltage setting of the potentiometer, the comparator provides an output signal. The time delay from the time the write pulse occurs until this signal is obtained is representative of the potentiometer setting. The system also provides a direct digital output from the counter by gating the counter outputs to a bus at the time the signal from the comparator is obtained. Thus, either a time interval representation of the potentiometer setting or a direct digital readout of the potentiometer setting may be obtained from the system.

3 Claims, 1 Drawing Sheet

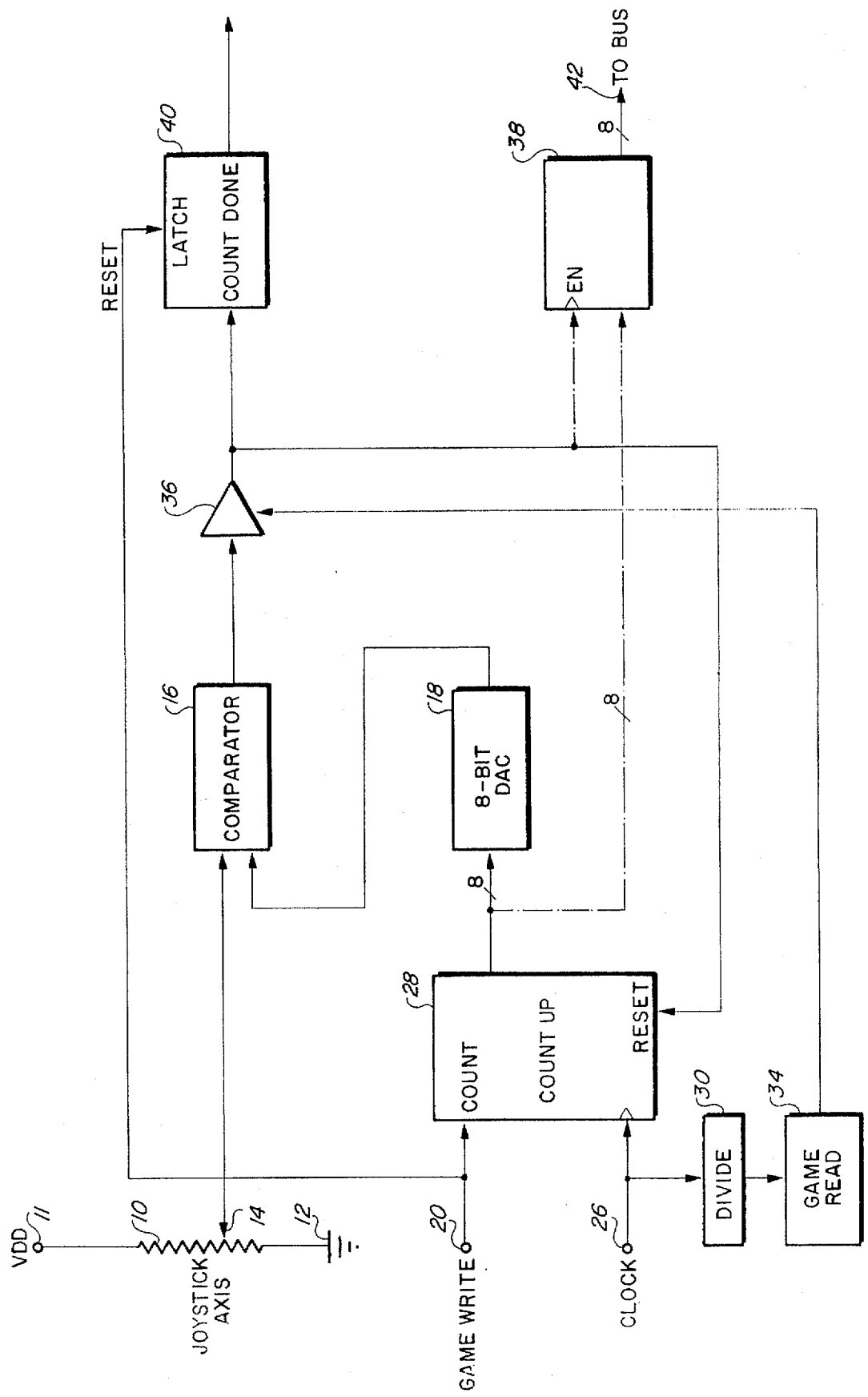

SYSTEM USING A DIGITAL TIMER FOR A JOYSTICK POTENTIOMETER READOUT

BACKGROUND

Many computer games have been developed using programs which interface with spatial manipulation of one or more "joysticks" in the form of analog potentiometers. The joystick swings through a range on the potentiometer which is used to set the time delay of a one-shot multi-vibrator whenever the player decides to select that setting of the potentiometer. When multiple potentiometers are used, the same approach is used to obtain the setting from each of the potentiometers. Typically, four orthogonally arranged potentiometers are employed in a joystick configuration to obtain four related settings, each of which sets a separate one-shot multi-vibrator to establish a different time delay, depending upon the different positions of the potentiometers at the time the player of the program requests a readout of the setting.

Since prior art joystick game inputs utilize the R/C analog time delay of a one-shot multi-vibrator, accuracy of the potentiometer output readout may be imprecise or inconsistent. The readings vary particularly with changes in temperature and with inherent variations in components during manufacturing. In addition, a relatively large component count for each of the one-shot multi-vibrators is required for such a system. The component count and the manufacturing costs for both the components and the assembly into the completed system cause such systems to be relatively expensive.

It is desirable to provide a system which consistently produces an accurate digital indication of the setting of an analog joystick potentiometer, and which remains compatible with the R/C multi-vibrator timer approach.

SUMMARY OF THE INVENTION

It is an object of this invention to provide an improved system for producing an output signal representative of the setting of a potentiometer.

It is another object of this invention to provide an improved system utilizing a digital counter for providing an output representative of the setting of a potentiometer.

It is an additional object of this invention to employ a digital counter and a digital-to-analog converter for producing a timeout signal corresponding to the setting of a joystick potentiometer.

In accordance with a preferred embodiment of this invention, a system is provided for digitizing the setting of a potentiometer. A comparator having first and second analog inputs and an output has the first input coupled with the potentiometer output. A digital counter is provided with a clock input and produces a digital output representative of the count therein as the counter is advanced. A source of clock signals is coupled to the clock input of the counter to incrementally change the count in it. The counter supplies signals to an analog-to-digital converter, which has an output coupled with the second input of the comparator. An output signal is produced by the comparator whenever a predetermined digital count is attained by the counter corresponding to the setting of the potentiometer. The time interval required to attain this digital count is indicative of the setting of the potentiometer. Whenever an output is obtained from the comparator, the actual count stored in the digital counter is a digital representation of the analog setting of the potentiometer.

BRIEF DESCRIPTION OF THE DRAWING

The sole FIGURE of the drawing is a block diagram of a preferred embodiment of the invention.

DETAILED DESCRIPTION

Reference now should be made to the drawing, which is illustrative of a preferred embodiment of the invention for digitizing the setting of a potentiometer. The system shown in the drawing is particularly suitable for use with computer games where inputs are obtained from the operation of a joystick to move a wiper or joystick axis to provide an output representative of the spatial position of the joystick. Such systems are well known in computer games. Typically, such systems employ four orthogonally placed potentiometers, which are operated by a joystick movable in limited orthogonal directions to change the settings of each of the four potentiometers. The settings of the potentiometers then are written at predetermined times by the program of the game or under control of the operator to provide an output indicative of the instantaneous potentiometer setting at the time the "write" signal is obtained.

In the drawing, a single one of a typical set of four joystick potentiometers is illustrated. The joystick potentiometer 10 is connected between a source of positive potential (VDD) 11 and ground 12. The potentiometer has a joystick axis or wiper which provides an analog voltage representation of the position of the wiper 14 on the potentiometer resistor 10. The joystick potentiometer 10 is of the type commonly used in video games and computer games.

The output of the wiper 14 for the potentiometer is supplied to one of two inputs of an analog comparator 16, the other input to which is obtained from the output of an eight-bit digital-to-analog converter 18. The input to the digital-to-analog converter 18 is an eight-bit input supplied over a bus from a digital counter 28, which initially is set to a predetermined initial count, typically "zero".

Upon application of a conventional game write pulse to an input lead 20, the counter 28 is enabled to commence counting. The game write pulse supplied over the lead 20 is the standard "write" pulse used with computer games and is obtained from the computer game system. Since the remainder of the computer game system is conventional, that system has not been shown in the drawing.

Free running clock signals which synchronize the entire computer game system are applied over a lead 26 to the counter 28 to cause it commence counting up from its initial zero or reset condition. At the same time, the clock pulses are applied through a divider 30 to produce a series of game read pulses 34. The frequency of the game read pulses 34 obviously is less than the frequency of the clock pulses 26 which cause advancement of the count in the counter 28.

The output of the counter 28 continuously is applied to the digital-to-analog converter 18; so that the output supplied from the converter 18 to the lower input of the comparator 16 continues to rise each time the count in the counter 28 increases. At some point, the analog voltage at the output of the converter 18 rises to equal the voltage set by the wiper 14 on the potentiometer 10; and a signal is obtained from the output of the comparator 16. This signal is applied to the input of a gated buffer amplifier 36, which is enabled by game read pulses from 34 produced by the divider 30. Whenever a game read pulse 34 occurs at the time a signal is present from the output of the comparator 16, an output pulse is applied to a bistable latch circuit 40, which provides a "countdown" or "read" pulse to the remainder of the circuit of the game with which the system shown in the drawing is used. The output of the bistable latch 40 is identical to the type of output typically obtained from a conventional R/C video game timer circuit; so that the system shown in the drawing is fully compatible with established video game software systems. The time interval between the "write" pulse which started operation of the counter 28 and the setting of the latch 40 is then resolved by the host system (not shown) into the joystick position.

It should be noted that the output of the gated buffer amplifier 36 also is supplied back to the reset input of the counter 28 to reset its count to its initial or "zero" value awaiting the application of the next write pulse on the terminal 20. Since the latch circuit 40 stores the output of the buffer amplifier 36 upon the occurrence of the game read pulse 34 described previously, the resetting of the counter 28 has no effect on the signal supplied to the rest of the system from the output of the bistable latch 40. When the next game write pulse is applied to the lead 20 to initiate operation of the counter 28, this pulse also is applied to the latch circuit 40 as a reset to set it back to its initial or "zero" condition awaiting the next game read signal from the output of the buffer amplifier 36.

The system shown in the drawing also may be used with systems directly employing a digital representation of the potentiometer setting. This is shown by a multiple bit gated amplifier 38, which obtains its input directly from the eight-bit bus from the counter 28 which also is connected to the input of the digital-to-analog converter circuit 18. The circuit 38 normally is disabled; but whenever the output of the comparator 16 is obtained, the signal from the gated amplifier 36 is applied to an enable input of the circuit 38 to cause the count present at that moment in the counter 28 to pass through the circuit 38 to the output bus 42. The output of the gated amplifier 36 is used as the enable input to the circuit 38 in the same manner in which the output of the amplifier 36 is used to latch the bistable latch 40, as described previously.

It is readily apparent from an examination of the system which is described above and shown in the drawing, that the system is fully compatible with computer games or video game systems requiring a pure digital output (such as provided by the circuit 38), as well as a game read or "countdown" time delay based output established between the time the game write pulse is applied at the input 20 and the output from the latch circuit 40 is obtained. This latter time interval based output is comparable to the R/C multivibrator time delay circuits employed with older computer game or video game systems. As a consequence, the system which is shown in the drawing is capable of "universal" use with video games requiring either type of output representation of the position of the joystick axis 14.

The foregoing description of the preferred embodiments of the invention is to be considered as illustrative and not as limiting. For example, the system specifically discloses one method of successive approximation for producing the outputs either at the latch 40 or the bus gate 38. Various changes and modifications will occur to those skilled in the art for performing substantially the same function, in substantially the same way, to achieve substantially the same result without departing from the true scope of the invention as defined in the appended claims.

What is claimed is:

1. A system for digitizing the setting of a joystick potentiometer including in combination:

a comparator having first and second inputs and an output, with the first input thereof coupled with said joystick potentiometer;

a digital counter with a clock input and having digital outputs representative of the count therein from an initial count;

a source of free running clock signals coupled to said clock input of said counter to incrementally change the count therein;

a digital-to-analog converter having the input thereof coupled with the digital outputs of said counter, and with an output coupled with the second input of said comparator to produce an output signal from said comparator when a predetermined count is attained by said counter corresponding to the setting of said potentiometer;

a latch circuit coupled to the output of said comparator for storing said output signal indicative of said attainment of said predetermined count by said counter, and said counter further having a reset input coupled with the output of said comparator whereupon said counter is reset to said initial count upon the occurrence of an output from said comparator; and a gated circuit coupled with the digital outputs of said counter and enabled by the output of said comparator for providing a digital output representative of said predetermined count in said counter which corresponds to the setting of said potentiometer.

2. The system according to claim 1 further including a source of signals for initiating operation of said counter.

3. The combination according to claim 2 further including a reset input on said latch circuit, with said reset input coupled with said source of signals for initiating operation of said counter.

\* \* \* \* \*